(12) United States Patent
Culler et al.

(10) Patent No.: US 6,708,126 B2
(45) Date of Patent: Mar. 16, 2004

(54) METHOD AND SYSTEM FOR MEASURING CURRENT

(75) Inventors: Mark Fredrick Culler, Kensington, CT (US); Scott Charles Evans, Burnt Hills, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/063,842

(22) Filed: May 17, 2002

(65) Prior Publication Data

US 2003/0216877 A1 Nov. 20, 2003

(51) Int. Cl.$^7$ .............................................. G01R 31/36
(52) U.S. Cl. ........................... 702/64; 702/61; 702/117; 702/183; 361/115; 361/93.1; 361/93.6; 361/86; 324/363; 324/260; 324/262; 324/522; 341/15; 341/16; 338/32 H; 338/32 R; 338/49
(58) Field of Search ............................... 702/57–59, 61, 702/62, 64, 65, 117, 122, 124, 126, 183, 188, FOR 103–FOR 106, 134; 361/115, 93.1, 93.6, 93.2, 35; 341/16, 108, 110, 144, 155; 324/263, 260, 262, 522, 713, 718; 338/32 H, 32 R, 49

(56) References Cited

U.S. PATENT DOCUMENTS 3,323,057 A * 5/1967 Haley ..................... 324/117 R
5,151,649 A * 9/1992 Heroux ........................ 324/127
5,717,326 A * 2/1998 Moriwaki ................... 324/117

FOREIGN PATENT DOCUMENTS

WO    WO 99/36928    7/1999

OTHER PUBLICATIONS

Newall Measurement Systems Ltd, Product Catalog Jun. 2001, pp. 1–10.*

* cited by examiner

Primary Examiner—Marc S. Hoff
Assistant Examiner—Elias Desta
(74) Attorney, Agent, or Firm—Cantor Colburn LLP

(57) ABSTRACT

A current sensing system including a carrier strip, the carrier strip disposed so as to be associated with a current carrying conductor, wherein when an electrical current flows through the conductor, the electrical current flowing through the conductor creates a magnetic field having a magnetic flux, wherein the magnetic flux is responsive to the electrical current flow, a Hall effect sensor disposed relative to the carrier strip such that the Hall effect sensor is communicated with the magnetic field, wherein the Hall effect sensor generates an electrical signal responsive to the magnetic flux and a metering device in communication with the Hall effect sensor, wherein the metering device processes the electrical signal so as to create a processed signal responsive to the electrical current flow. A method for measuring current including obtaining a current sensing system having a Hall effect sensor and an electrical circuit having a conductor, wherein the current sensing system is disposed such that the Hall effect sensor is associated with the conductor, operating the electrical circuit so as to cause an electrical current to flow through the conductor, generating an electrical signal responsive to the electrical current flow using the Hall effect sensor; communicating the electrical signal with a metering device and processing the electrical signal so as to create a processed signal responsive to the electrical current flow.

21 Claims, 3 Drawing Sheets

METHOD AND SYSTEM FOR MEASURING CURRENT

BACKGROUND OF INVENTION

This invention relates generally to an electrical current sensing system, and more particularly to a method and system for measuring current in a circuit breaker panel. Circuit breaker panels typically include a housing having slots for supporting a plurality of circuit breakers disposed adjacent to one another, wherein each circuit breaker controls and protects the current in one distribution circuit. The circuit breaker panel includes openings for main power lines leading from a main circuit breaker or power transformer and for circuit wiring leading to outlets, fixtures, or equipment on the premises.

In residential or commercial electrical installations it is sometimes advantageous to know whether or not a given circuit is carrying current and how much current is flowing. This current flow information is useful, for example, in profiling loads, identifying points of energy use, and optimizing the operation of equipment such as heating and cooling systems. It is also useful for estimating the costs associated with operating each circuit. The current flow for each circuit is usually measured using current sensors that are installed in each circuit. The current sensors may be connected to a metering package or device that is used for monitoring the circuit current flow. Existing designs accomplish this "circuit panel metering" by installing a toroidal current sensor around the wire that connects a load to an individual circuit breaker. This involves feeding each load wire through a current transformer core and running the wires from the secondary winding of the current transformer out of the circuit breaker box through a feed tube and then into the metering device. This is a time- and labor-intensive process, particularly for retrofit applications.

SUMMARY OF THE INVENTION

A current sensing system comprising: a carrier strip, the carrier strip disposed so as to be associated with a current carrying conductor, wherein when an electrical current flows through the conductor, the electrical current flowing through the conductor creates a magnetic field having a magnetic flux, wherein the magnetic flux is responsive to the electrical current flow; a Hall effect sensor disposed relative to the carrier strip such that the Hall effect sensor is communicated with the magnetic field, wherein the Hall effect sensor generates an electrical signal responsive to the magnetic flux; and a metering device in communication with the Hall effect sensor, wherein the metering device processes the electrical signal so as to create a processed signal responsive to the electrical current flow.

A method for measuring current comprising: obtaining a current sensing system having a Hall effect sensor and an electrical circuit having a conductor, wherein the current sensing system is disposed such that the Hall effect sensor is associated with the conductor; operating the electrical circuit so as to cause an electrical current to flow through the conductor; generating an electrical signal responsive to the electrical current flow using the Hall effect sensor; communicating the electrical signal with a metering device; and processing the electrical signal so as to create a processed signal responsive to the electrical current flow.

BRIEF DESCRIPTION OF DRAWINGS

Referring to the exemplary drawings wherein like elements are numbered alike in the several Figures.

DETAILED DESCRIPTION ne way to measure or sense the amount of current flowing in a conductor is to recognize that as a current flows through a conductor, a magnetic field is generated around the conductor wherein the magnetic flux is proportional to the current flowing through the conductor. Therefore, one can measure the current flowing through a conductor by measuring the magnetic flux surrounding the conductor. A Hall effect sensor (HES) is a sensor that, when exposed to a magnetic field generated by a current flowing in a conductor, detects the components of the magnetic flux and produces a proportional electrical signal. Thus, the current flowing in the conductor can then be determined by examining the electrical signal produced by the HES.

Figure 1:
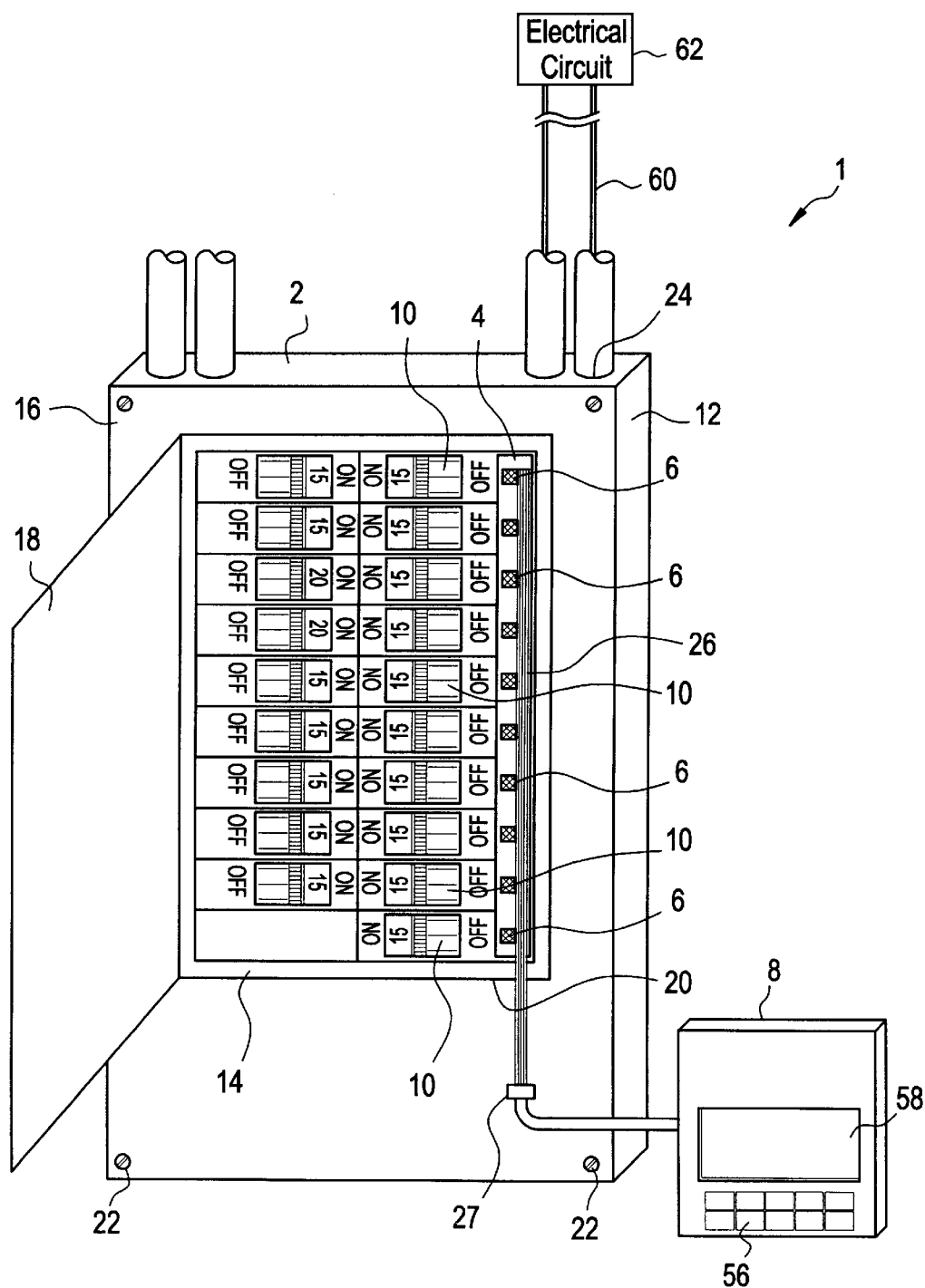
FIG. 1 shows a system for sensing current in a plurality of circuit breakers.

Referring to FIG. 1, an exemplary embodiment of a current sensing system 1 is shown and discussed. Current sensing system 1 includes a circuit breaker panel 2, a carrier strip 4, a Hall effect sensor (HES) 6 and a metering device 8. Circuit breaker panel 2 includes a circuit breaker 10 and a panel housing 12, wherein panel housing 12 defines a panel cavity 14 and includes a panel cover 16 and a panel door 18. Panel cover 16 is re-movably associated with panel housing 12 and is disposed relative to panel housing 12 so as to enclose panel cavity 14. Panel cover 16 includes a panel opening 20 disposed so as to allow communication with panel cavity 14. Panel door 18 is movably associated with panel cover 16 and is preferably disposed so as to be enclosingly associated with panel opening 20. Panel cover 16 may be secured to panel housing 12 via screws 22, however panel cover 16 may be secured using any securing device suitable to the desired end purpose.

Circuit breaker 10 is disposed within panel cavity 14 so as to be non-movably associated with panel housing 12. In addition, circuit breaker 10 is disposed relative to panel opening 20 so as to allow communication with circuit breaker 10 via panel opening 20. Circuit breaker 10 is also communicated with a conductor 60, wherein conductor 60 carries a current to a load contained within an electrical circuit 62 and wherein circuit breaker 10 is disposed so as to protect electrical circuit 62 from potentially dangerous electrical fault conditions. Moreover, conductor 60 is communicated with circuit breaker 10 via a wire opening 24 in panel housing 12 so as to be contained within panel cavity 14. Moreover, although electrical circuit 62 is preferably disposed external to circuit breaker panel 2, electrical circuit 62 may be disposed in any location suitable to the desired end purpose.

Figure 2:
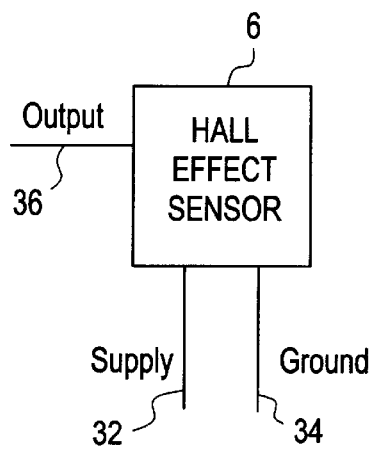
FIG. 2 shows a Hall effect sensor.
Figure 3:
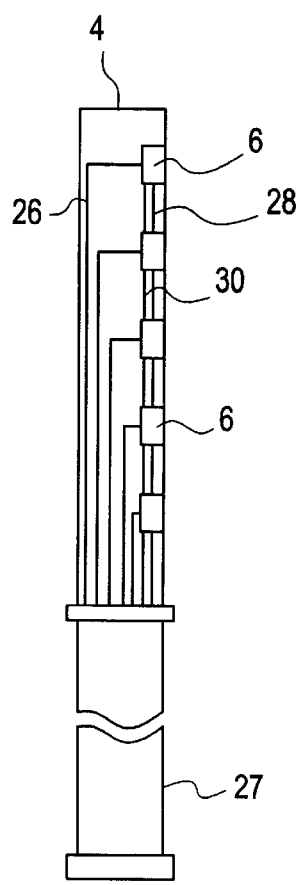
FIG. 3 is a schematic representation of a carrier strip.

Referring to FIG. 2 and FIG. 3, HES 6 and carrier strip 4 is shown in further detail. HES 6 is non-movably associated with carrier strip 4, wherein carrier strip 4 includes a strip communication lead 26, a strip power lead 28 and a strip ground lead 30. In addition, HES 6 includes a sensor power lead 32, a sensor ground lead 34 and a signal lead 36, wherein HES 6 is non-movably associated with carrier strip 4 such that strip power lead 28 is communicated with sensor power lead 32, strip ground lead 30 is communicated with sensor ground lead 34 and signal lead 36 is communicated with strip communication lead 26. In a circuit breaker panel 2 having a plurality of circuit breakers 10, carrier strip 4 may include a plurality of HES's 6 disposed such that one of each of the plurality of HES's 6 is associated with a conductor 60 communicated with one of each of the circuit breakers 10. Moreover, each of the plurality of HES's 6 is communicated with metering device 8 via carrier strip 4.

Carrier strip 4 includes an adhesive backing and may be disposed so as to be removably associated with circuit breaker 10. The adhesive backing of carrier strip 4 advantageously allows carrier strip 4 and thus HES 6 to be easily disposed so as to be associated with conductor 60 of circuit breaker 10 without disconnecting any wiring to or from circuit breaker 10. In addition, carrier strip 4 may be associated with circuit breaker 10 without requiring the removal of panel cover 16. Although carrier strip 4 is described hereinabove as being associated with conductor 60 via an adhesive backing, carrier strip 4 may be associated with conductor 60 via any method or device suitable to the desired end purpose, such as snaps molded onto circuit breaker 10 and/or mechanical fasteners.

Moreover, the adhesive backing of carrier strip 4 advantageously allows carrier strip 4 to be easily disposed such that one of each of the plurality of HES's 6 is associated with one of each of the plurality of circuit breakers 10, wherein each of the plurality of HES's 6 is disposed relative to the conductor 60 of each of the plurality of circuit breakers 10 so as to be communicated with the magnetic field generated by the current flowing through each conductor 60. Strip power lead 28 and strip ground lead 30 are communicated with a power source so as to supply operating power to HES 6. Moreover, although operating power is preferably supplied via metering device 8, operating power may be supplied by any internal and/or external device or method suitable to the desired end purpose, such as a battery.

Figure 4:
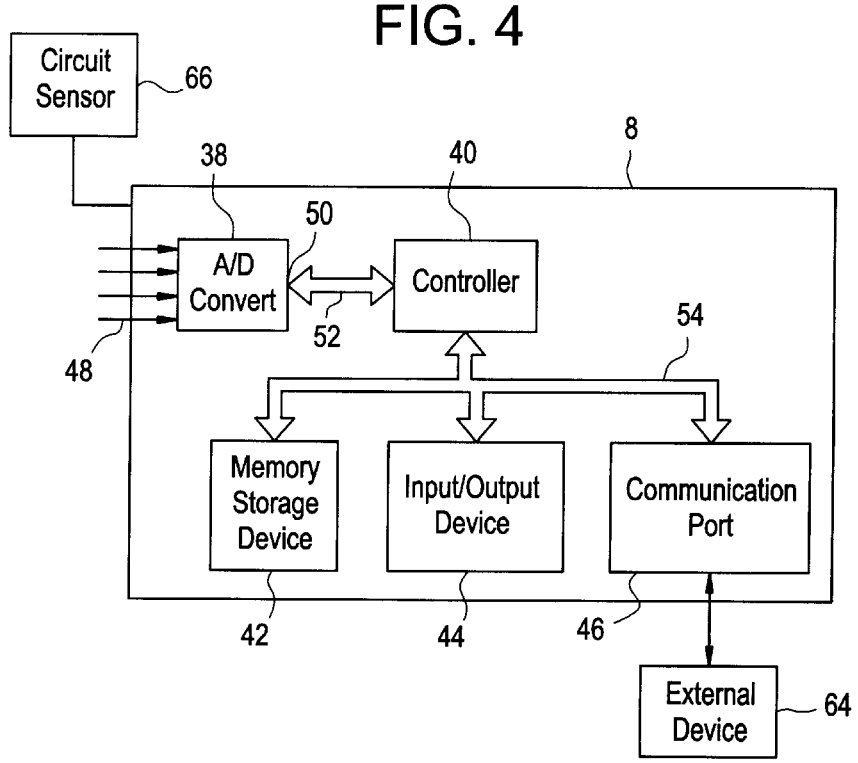
FIG. 4 is a schematic representation of a metering device.

Referring to FIG. 4, an exemplary metering device 8 is shown in further detail. Metering device 8 includes an analog-to-digital converter 38, a controller 40, a memory storage device 42, an input/output device 44 and a communications port 46. Analog-to-digital converter 38 includes a converter input 48 and a converter output 50, wherein converter output 50 is communicated with controller 40 via a data path 52 and wherein converter input 48 is communicated with strip communication lead 26 via a connector 27 so as to allow communication between HES 6 and metering device 8. Controller 40 is further communicated with memory storage device 42, input/output device 44 and communications port 46 via a data bus 54, wherein communications port 46 is disposed so as to allow communication with an external system or device 64, such as communications network. In addition, input/output device 44 includes a keypad 56 and a display 58.

In an exemplary embodiment, current sensing system 1 operates as described hereinbelow. As electrical circuit 62 operates, a current flows through conductor 60 producing a magnetic field that surrounds conductor 60, wherein the magnetic field is responsive to the level of current flowing through conductor 60. HES 6, which is disposed so as to be associated with conductor 60 and hence exposed to the magnetic field surrounding conductor 60, senses the magnetic flux and produces an analog electrical signal responsive to the strength of the magnetic field surrounding, and hence the current flowing through, conductor 60. This electrical signal is then communicated to strip communication lead 26 via signal lead 36. Analog-to-digital converter 38 obtains this electrical signal via converter input 48 and converts this electrical signal from an analog signal into a digital signal, so as to produce a digital signal responsive to the current level flowing through conductor 60. Controller 40 obtains this converted signal via data path 52, wherein controller 40 processes the digital signal so as to create a processed signal, wherein the processed signal is responsive to the current level flowing through conductor 60.

Metering device 8 is communicated with a circuit sensor 66, wherein circuit sensor 66 is disposed so as to sense an electrical circuit characteristic, such as line voltage or circuit load, wherein the processed signal is further responsive to this electrical circuit characteristic. As such, this processed signal may advantageously be used for monitoring or diagnostic purposes, such as to determine the total energy usage for electrical circuit 62 over a given period of time. In addition, this information may then be communicated or displayed to a user or a technician via display 58. Moreover, keypad 56 may be used to communicate data and/or instructions such as clock setting, and reset instructions, as well as provide other user-definable operation parameters.

Figure 5:
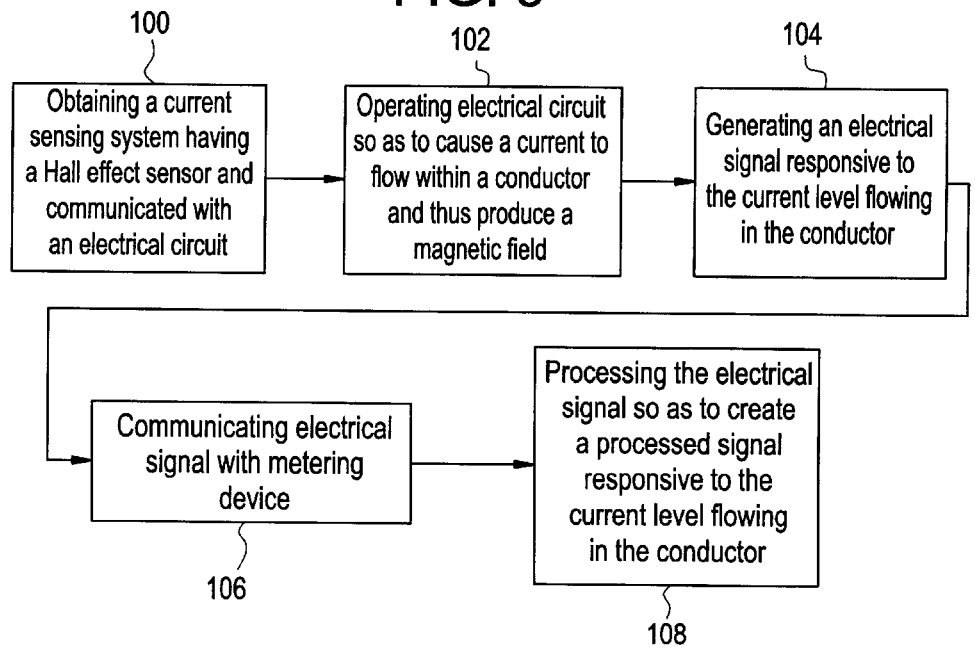
FIG. 5 is a block diagram describing a method for measuring current in a circuit breaker using a Hall effect sensor.

Referring to FIG. 5, a method for measuring current in a circuit breaker is illustrated and discussed. In an exemplary embodiment, a current sensing system 1 communicated with an electrical circuit 62 is obtained, as shown in step 100. Electrical circuit 62 is then operated so as to cause a current to flow within conductor 60, and thus so as to cause a magnetic field to surround conductor 60, as shown in step 102. HES 6, which is disposed so as to be immersed within the magnetic field surrounding conductor 60, then generates an electrical signal responsive to the current level flowing through conductor 60, as shown in step 104. This electrical signal is then communicated to metering device 8 via strip communication lead 26, as shown in step 106. Metering device 8 then processes this electrical signal so as to create a processed signal, as shown in step 103. In accordance with an exemplary embodiment, this is accomplished by analog-to-digital converter 38 obtaining the electrical signal via converter input 48 and converting the electrical signal into a digital signal so as to create a digital signal responsive to the current level flowing through conductor 60. This digital signal is then communicated to controller 40, wherein controller 40 processes the digital signal so as to create a processed signal responsive to the current level flowing through conductor 60. Once this has been accomplished, the processed signal is then communicated to memory storage device 42, input/output device 44 and/or communications port 46, for storage and/or communication. In an exemplary embodiment, communications port 46 is preferably a serial port. However, communications port 46 maybe any communications port 46 suitable to the desired end purpose, such as a parallel port, USB port and/or wireless network port.

Controller 40 is preferably contained within metering device 8. However, controller 40 may be disposed internal and/or external to metering device 8. In addition controller 40 may be any controller suitable to the desired end purpose.

Memory storage device 42 is preferably non-volatile memory, such as flash memory. However, memory storage device 42 may include any memory storage device and/or method suitable to the desired end purpose, such as Read Only Memory and/or Random-Access Memory.

Input/output device 44 preferably includes keypad 56 and/or display 58 for communicating data and/or instructions to metering device 8. However, input/output device 44 may be any input/output device, disposed internal and/or external to metering device 8, suitable to the desired end purpose, such as a computer. In addition, an external input/ output device may be disposed at a remote location and/or may be communicated with metering device 8 via communications port 46. Furthermore, an external input/output device may be remotely communicated with metering device 8 via a LAN, a WAN, the Internet and/or via a wireless communication system.

Carrier strip 4 is preferably constructed of a plastic material. However, carrier strip 4 may be constructed from any material suitable to the desired end purpose. In addition, although carrier strip 4 is preferably re-movably associated with circuit breaker 10 via an adhesive, carrier strip 4 may be re-movably associated with circuit breaker 10 via any device or method suitable to the desired end purpose.

Conductor 60 is preferably constructed of copper. However, conductor 60 may be constructed from any material suitable to the desired end purpose.

The electrical signal is preferably an analog signal. However, the electrical signal may be in digital form and thus may be directly communicated with controller 40. In addition, it is considered with the scope of an exemplary embodiment, that a plurality of electrical signals may be processed and/or communicated to and/or from metering device 8.

HES 6 may be any HES suitable to the desired end purpose, including sensors that perform sub-processing, error calculations, error corrections and/or any other functions.

In addition, it is considered within the scope of an exemplary embodiment, that processing and/or sub-processing of the electrical signal may be performed external to metering device 8, such as in the HES 6 or in a processing device disposed external to metering device 8.

Processing of step 108 of FIG. 5 may be implemented through a controller 40 operating in response to a computer program. In order to perform the prescribed functions and desired processing, as well as the computations therefore (e.g., the calculation of the power usage, the control processes prescribed herein, and the like), the controller may include, but not be limited to, a processor(s), computer(s), memory, storage, register(s), timing, interrupt(s), communication interfaces, and input/output signal interfaces, as well as combinations comprising at least one of the foregoing. For example, the controller may include signal input signal filtering to enable accurate sampling and conversion or acquisitions of such signals from communications interfaces.

While the invention has been described with reference to an exemplary embodiment, it will be understood by those skilled in the art that various changes may be made and equivalents may be substituted for elements thereof without departing from the spirit and/or scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A current sensing system comprising:
    a carrier strip disposed so as to be associated with a first and a second current carrying conductor, wherein a first electrical current at said first conductor creates a first magnetic field having a first magnetic flux responsive to said first electrical current, and a second electrical current at said second conductor creates a second magnetic field having a second magnetic flux responsive to said second electrical current;
    a first and a second Hall effect sensor coupled to said carrier strip such that said first and second Hall effect sensors are in signal communication with said first and second magnetic fields, wherein said first and second Hall effect sensors generate a first and a second electrical signal responsive to said first and said second magnetic flux; and
    a metering device in communication with said first and second Hall effect sensors, wherein said metering device processes said first and second electrical signals so as to create a first and a second processed signal responsive to said first and said second electrical current.

2. The system according to claim 1, wherein:
    said first and second conductors are associated with a first and a second circuit breaker; and
    said carrier strip is secured proximate said first and second circuit breakers via an adhesive backing.

3. The system according to claim 1, wherein said carrier strip is constructed of a plastic material.

4. The system according to claim 1, further comprising:
    a plurality of conductors in excess of two; and
    a plurality of Hall effect sensors coupled to said carrier strip such that one each of said plurality of Hall effect sensors is associated with one each of said plurality of conductors.

5. The system according to claim 1, wherein:
    said metering device includes an analog-to-digital converter and a controller; and
    said metering device is in signal communication with said first and second Hall effect sensors via said analog-to-digital converter.

6. The system according to claim 5, wherein said analog-to-digital converter processes said first and second electrical signals so as to create first and second digital signals responsive to said first and second electrical currents.

7. The system according to claim 6, wherein said controller processes said first and second digital signals so as to create said first and second processed signals.

8. The system according to claim 1, wherein said metering device includes a memory storage device, a communications port and an input/output device, wherein said input/output device includes a keypad and a display.

9. The system according to claim 8, wherein said communications port is a serial communications port.

10. The system according to claim 8, wherein said display is an LCD display.

11. A method for measuring current comprising:
    securing a carrier strip proximate a first and a second conductor in an electrical circuit, said carrier strip including a first and a second Hall effect sensor coupled thereto, said first and second Hall effect sensors being associated with said first and second conductors;
    operating said electrical circuit so as to cause a first and a second electrical current to flow through said first and second conductors;
    generating a first and a second electrical signal responsive to said first and second electrical currents using said first and second Hall effect sensors;
    communicating said first and second electrical signals with a metering device; and
    processing said first and second electrical signals so as to create a first and a second processed signal responsive to said first and second electrical currents.

12. The method of claim 11, wherein said first and second electrical signals are analog signals.

13. The method of claim 11, wherein said communicating includes communicating said electrical signals with said metering device via said carrier strip.

14. The method of claim 11, wherein said processing includes converting each of said electrical signals from an analog signal into a digital signal via an analog-to-digital converter.

15. The method of claim 14, wherein said processing includes processing said digital signal via a controller.

16. The method of claim 11, wherein said processed signals are further responsive to an electrical characteristic.

17. The method of claim 16, wherein said electrical characteristic is a circuit voltage.

18. The method of claim 11, wherein said processing includes communicating said first and second processed signals to an external device via a communications port.

19. The method of claim 11, wherein said processing includes communicating said first and second processed signals with a memory storage device.

20. The method of claim 11, wherein said processing includes communicating said first and second processed signals with an input/output device.

21. The method of claim 11, wherein said securing includes:

adhering said carrier strip to a panel disposed proximate said first and second conductors.

* * * * *